United States Patent
Chen et al.

(10) Patent No.: US 7,459,638 B2
(45) Date of Patent: Dec. 2, 2008

(54) ABSORBING BOUNDARY FOR A MULTI-LAYER CIRCUIT BOARD STRUCTURE

(75) Inventors: Houfei Chen, Boise, ID (US); Shiyou Zhao, Boise, ID (US); Hao Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 323 days.

(21) Appl. No.: 11/114,589

(22) Filed: Apr. 26, 2005

(65) Prior Publication Data

US 2006/0237223 A1    Oct. 26, 2006

(51) Int. Cl.
*H05K 1/03* (2006.01)

(52) U.S. Cl. .................. 174/255; 174/262; 361/760
(58) Field of Classification Search ............ 174/255, 174/262; 361/760
See application file for complete search history.

(56) References Cited

U.S. PATENT DOCUMENTS

| | | | |
|---|---|---|---|
| 5,966,294 A * | 10/1999 | Harada et al. | 361/794 |
| 6,104,258 A * | 8/2000 | Novak | 333/22 R |
| 6,353,540 B1 * | 3/2002 | Akiba et al. | 361/794 |
| 6,441,313 B1 | 8/2002 | Novak | 174/255 |
| 6,789,241 B2 | 9/2004 | Anderson et al. | 716/5 |

OTHER PUBLICATIONS http://www.eccosorb.com/principles/tecnote.asp (Mar. 1, 2005).
http://www.cumingmw.com/micro_rf_pc_330.html. and Date Sheets for 330-I through 330-8 C-RAM materials (published date unknown).
"PCB/Overview," published at www.ul.ie/~rinne/ee6471/ee6471%20wk11.pdf (Apr. 11, 2004).

\* cited by examiner

*Primary Examiner*—Tuan T Dinh
*Assistant Examiner*—Yuriy Semenenko
(74) *Attorney, Agent, or Firm*—Wong, Cabello, Lutsch, Rutherford & Brucculeri, LLP

(57) ABSTRACT

The invention comprises an improved PCB board design having particular utility for high frequency application, and especially useful to alleviate the problem of electromagnetic disturbance of signals switching through power and ground planes. In one embodiment, the PCB contains a magnetically loaded absorbing boundary to absorb the EM disturbances and keep them from resonating inside the cavity between the power and ground planes. The boundary is preferably placed at an edge or edges of the PCB, where it is unlikely to affect any other signals on the PCB. Exemplary materials for the boundary have a magnetic loss tangent of 1.0 to 1.5 with an attenuation constant of −20 dB/cm over frequencies of interest. Depending on whether the boundary material is solid or non-solid, it may be adhered to the edges of the PCB, or may be applied to the edge and cured. It is preferable that the boundary material span through substantially the entire height of the dielectric cavity between the power and ground planes to best absorb the electromagnetic disturbances.

18 Claims, 11 Drawing Sheets

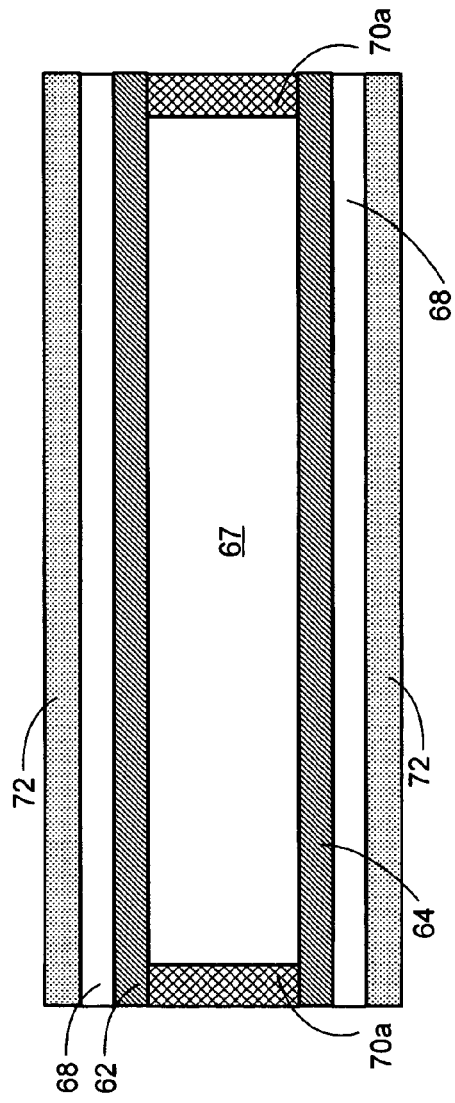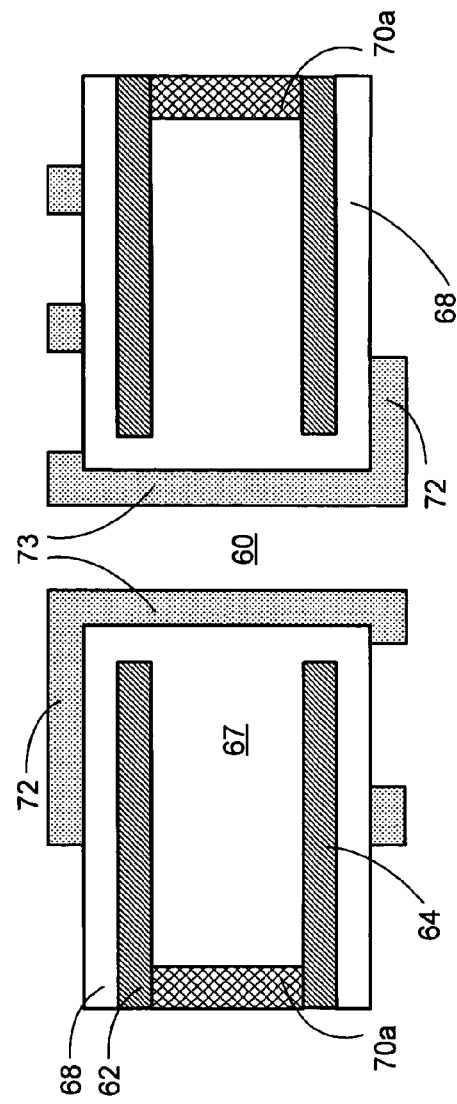
Figure 6E
Figure 6F

ABSORBING BOUNDARY FOR A MULTI-LAYER CIRCUIT BOARD STRUCTURE

CROSS REFERENCE TO RELATED APPLICATIONS

This application relates to an application Ser. No. 11/114,420 entitled "Circuit Board Via Structure for High Speed Signaling," which is filed concurrently with the U.S. Patent & Trademark Office, and which is incorporated herein by reference in its entirety.

FIELD OF THE INVENTION

Embodiments of this invention relate to printed circuit boards, and in particular to an improved design for minimizing electromagnetic disturbance using a magnetically-loaded absorbing boundary.

BACKGROUND

In a multilayer printed circuit board (PCB), there are occasions that signals have to switch signaling planes in the PCB. FIGS. 1A and 1B illustrate such signal plane switching. As best shown in the cross sectional view of FIG. 1B, a signal trace 18t originally proceeding on top of a PCB 15 meets with a via 18 appearing through the PCB 15 and down to another signal trace 18b on the bottom of the PCB 15. Thus, by use of the via 18, the signal trace is allowed to change planes in the printed circuit board, which can facilitate signal routing.

Also present in the PCB 15 are power (i.e., Vdd) and ground planes, respectively numbered as 12, 14, and referred to collectively as "power planes." These power planes 12, 14 allow power and ground to be routed to the various devices mounted on the board (not shown). (Although shown with the power plane 14 on top of the ground plane 12, these planes can be reversed). When routing a signal through these power planes, it is necessary to space the via 18 from both planes 12, 14, what is referred to as an antipad diameter 12h, 14h. The vias themselves at the level of the signal planes have pads to facilitate routing of the signals 18t, 18b to the via, which have a pad diameter (18p) larger than the diameter of the via 18 itself (d). Typical values for the diameter of the via (d), the pad diameter (18p) and the antipad diameter (12h, 14h) are 16, 20, and 24 mils respectively. It should be understood that an actual PCB 15 might have several different signal and power planes, as well as more than two signal planes, although not shown for clarity.

When a signal trace such as 18t, 18b switches signal planes, the signal return current—a transient—will generate electromagnetic (EM) waves that propagate in the cavity 17 formed between the power and ground planes 12, 14. More specifically, when a signal trace switches planes, if there is no decoupling capacitance around the switching point, a high frequency return current will proceed through the capacitance formed by the power and ground planes 12, 14. Due to the limited size and open boundary of the PCB 15, the cavity 17 between the planes 12, 14 is induced with EM waves. Such EM waves will cause electrical disturbance on the signal being switched, as well as other signals traces. Such disturbances are especially felt in other near-by signals traces that are also switching signal planes, such as signal traces 16t, 16b (FIG. 1A) due to coupling between the vias (i.e., 18 and 16). Moreover, such EM disturbances are significantly enhanced around the resonant frequencies of the power/ground cavity 17, which in turn are determined by the physical dimensions of the power planes 12, 14. Via-to-via coupling induced by signal plane switching can cause significant cross-talk, and can be particularly problematic for high frequency switching applications.

FIGS. 2 and 3, representing computer simulations on the structure of FIG. 1A, illustrate these problems. In these simulations, one of the signal lines (say, signal 16) is an "aggressor" through which a simulated signal is passed, and the other signal line (signal 18) is the "victim" whose perturbation is monitored. The simulations were run in HFSS™, which is a full-wave three-dimensional EM solver available from Ansoft Corporation of Pittsburgh, Pa. The simulations were run assuming a 2.0-by-0.4 inch PCB 15, a spacing of 100 mils between the two vias 16, 18, a height of 54 mils between the power planes 12, 14 defining the cavity 17, and use of an FR4 dielectric for the PCB 15 (with a dielectric constant of 4.2 and a loss tangent of 0.02). Traces 16t, 16b, 18t, and 18b were assumed to be microstrip lines with a characteristic impedance of 40 ohms. Via diameters, via pad diameters, and antipad diameters were assumed to have the values mentioned previously.

FIGS. 2 and 3 respectively show the transmission and reflection coefficients of the aggressor signal, and significant signal insertion and return loss is observed around certain resonant frequencies. The measured parameter is a scattering parameter (S-parameter), which is a standard metric for signal integrity and which is indicative of the magnitude of the EM disturbance caused by signal plane switching. FIG. 4 shows the coupling coefficient between the aggressor and victim signals. As can be seen, the coupling coefficient stands close to −8 dB around certain resonant frequencies, indicating significant cross-talk between the aggressor and the victim. If the signals used on the PCB 15 have component frequencies at or near these resonance peaks, circuit performance and signal integrity could be compromised.

The prior art has sought to remedy these problems in a number of different ways. In U.S. Pat. No. 6,789,241, incorporated herein by reference, it was taught to place decoupling capacitors between the power and ground planes on a PCB at different locations. But such a solution is not optimal, due to significantly high effective series inductances that exist in decoupling capacitors at high frequencies. In U.S. Pat. No. 6,441,313, also incorporated herein by reference, it was taught to use a dielectric material between the power and ground planes with a high dielectric loss tangent. However, such materials exhibit loss tangents on the order of 0.2 to 0.3, which is too low to significantly mitigate the EM disturbance problem discussed above. Moreover, because the '313 patent applies the high loss tangent material through the entirety of the cavity between the power and ground planes on the PCB, it will inevitably adversely affect any stripline structures between those two planes.

Thus, the art would be benefited from strategies designed to minimize problems associated with signals switching signal planes in a printed circuit board. This disclosure provides such a solution in the form of an EM-absorbing boundary material applied at the edges of the PCB.

SUMMARY

The invention comprises an improved printed circuit board design having particular utility for high frequency applications, and especially useful to alleviate the problematic electromagnetic disturbance of signals switching through power and ground planes. In one embodiment, the PCB contains a magnetically loaded absorbing boundary to absorb the EM disturbances and keep them from resonating inside the cavity between the power and ground planes. The boundary is preferably placed at an edge or edges of the PCB, where it is unlikely to affect any other signals on the PCB. One exemplary material for the boundary is the Series 330-X family of rigid and castable Absorbers, manufactured by Cuming Microwave Corporation, with such material preferably having a magnetic loss tangent of 1.0 to 1.5 with an attenuation constant of −20 dB/cm over frequencies of interest. Depending on whether the boundary material is solid or non-solid, it may be adhered to the edges of the PCB, or may be applied to the edge and cured. It is preferable that the boundary material span through substantially the entire height of the dielectric cavity between the power and ground planes to best absorb the electromagnetic disturbances.

BRIEF DESCRIPTION OF THE DRAWINGS

Embodiments of the inventive aspects of this disclosure will be best understood with reference to the following detailed description, when read in conjunction with the accompanying drawings, in which:

FIGS. 6A-6F illustrate sequential steps for the construction of a PCB having the absorbing material in which the absorbing material is initially a solid.

DETAILED DESCRIPTION

Figure 5:
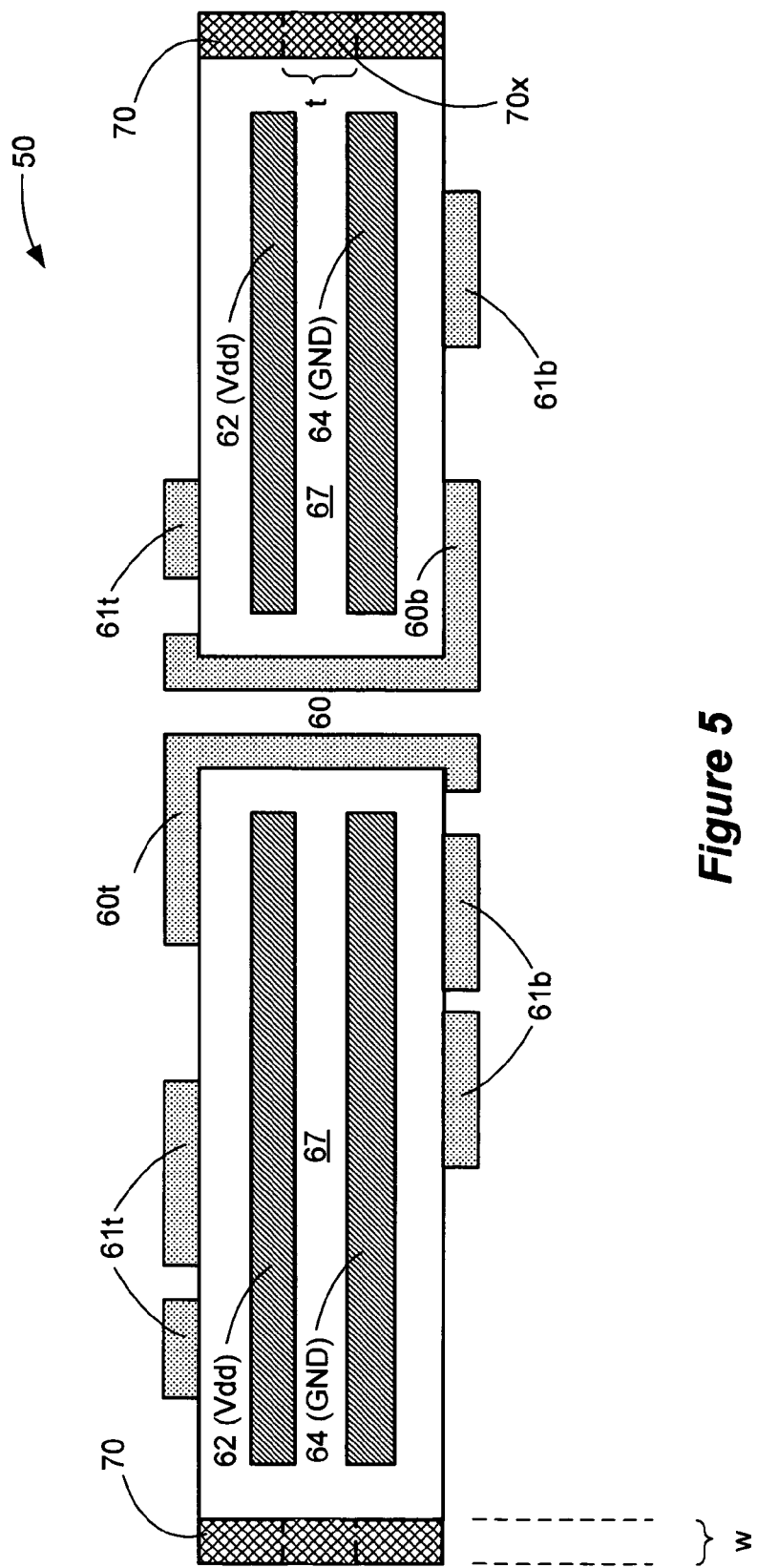
FIG. 5 illustrates a cross section of the disclosed improved PCB design having an absorbing boundary material at the edges of the PCB bounding the cavity formed by the power and ground planes.

FIG. 5 shows an improved PCB structure 50 for ameliorating the problem of EM disturbances in the cavity 67 between the power and ground planes as discussed earlier. As shown, and similar to FIG. 1B, a signal 60 switches from the top (60t) to the bottom (60b) of the PCB 66 through via 60, the problematic condition discussed earlier. Also similar to FIG. 1B, power and ground planes 62 and 64 are present. One skilled in the art will realize that while only one exemplary via 60 is shown, in reality a given cross section of the PCB 50 would likely reveal many vias. Additionally, one skilled will understand that other signal traces will likely be apparent in cross section at the signal planes, and a few exemplary traces 61t, 61b are shown.

Figure 1A:
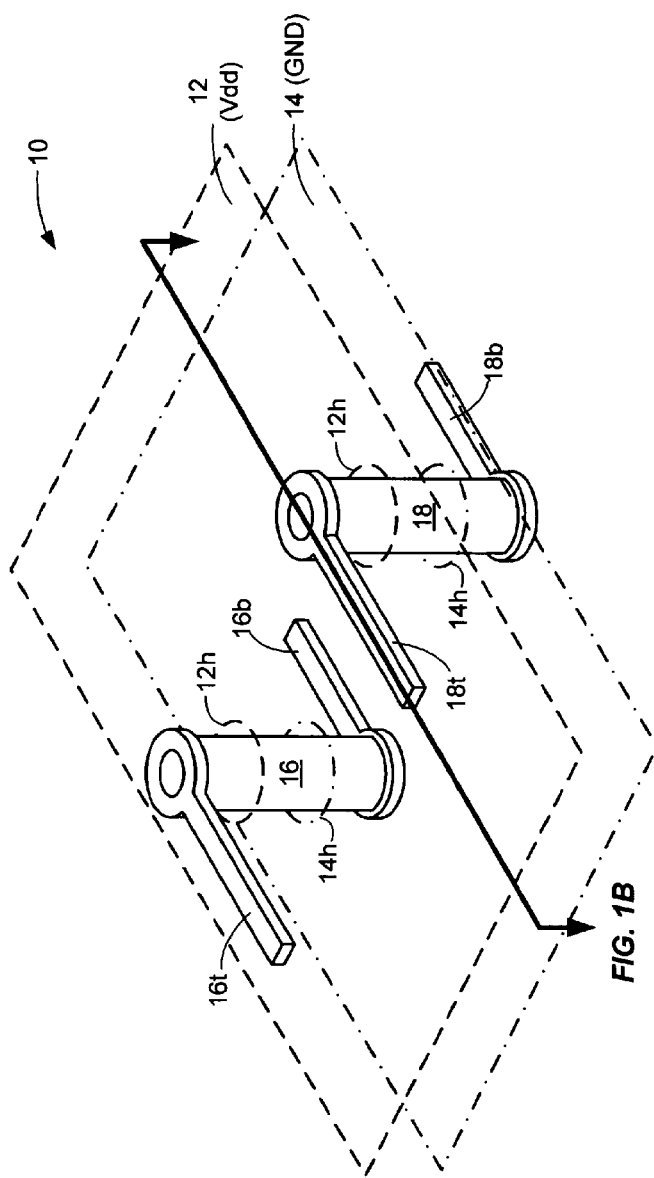
FIG. 1A illustrates a perspective view of two prior art vias both switching signal planes through power and ground planes.
Figure 1B:
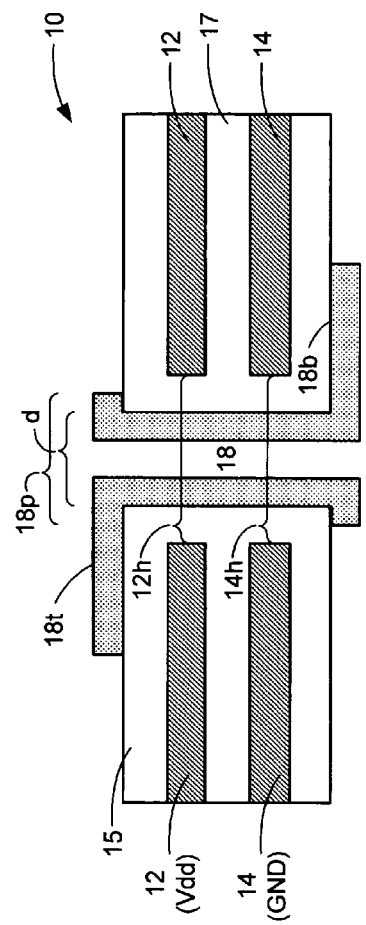
FIG. 1B illustrates a cross section of one of the vias of FIG. 1A.

In distinction to FIG. 1B, the PCB 50 is bounded by an absorbing boundary 70, the function of which is to absorb any EM disturbances which might be resonating in the cavity 67 due to signal return current through the via 60, or due to other parasitic EM disturbances. The absorbing boundary is preferably magnetically loaded, and has a high magnetic loss tangent of 1.0 to 1.5 with an attenuation constant of −20 dB/cm. A magnetically loaded material comprises ferromagnetic particles (e.g., iron, nickel, cobalt) to increase the magnetic loss tangent. This loss tangent is significantly higher than prior art techniques (discussed earlier), and unique in that the material is placed only at the edges of the PCB 50. Because the absorbing material 70 is positioned at the edges of the PCB 50, as opposed to in the cavity 67 itself, signal traces (60t, 61t, 60b, 61b) are not adversely affected. Hence, resonance is absorbed without affecting circuit performance.

The use of high loss tangent materials such as absorbing material 70 in a high frequency PCB 50 seems counterintuitive. The loss tangent generally determines the loss of the medium, such that low loss tangents result in a "fast" PCB while large loss tangents result in a "slow" PCB). However, as just noted, by using the absorbing material 70 only at the edges of the PCB 50 (or more specifically, at the edges of the cavity 67), general performance of the circuitry can be preserved while attenuating the EM disturbances at the edge of the PCB, where they would otherwise reflect, causing unwanted resonance.

To effectively absorb the energy, the absorbing material 70 preferably exhibits high EM attenuation over a broad range of frequencies. In this regard, note that the loss of a dielectric material is determined by its dielectric loss tangent (i.e., the tangent of the complex permittivity: $\tan(\delta_d) = \in''/\in'$, where $\in = \in' + i\in''$) and its magnetic loss tangent (i.e., the tangent of the complex permeability: $\tan(\delta_m) = \mu''/\mu'$, where $\mu = \mu' + i\mu''$). This dualistic nature of loss is reflected in a given material's "attenuation constant," which is a function of both the dielectric loss tangent and the magnetic loss tangent. This is explained via equations published on the internet at the URL address originally cited upon the filing of this application, which provides an equation for the attenuation constant as a function of the dielectric loss tangent and the magnetic loss tangent as a function of frequency. These equations are incorporated by reference, and are submitted in the Information Disclosure statement filed with this application. When a magnetically loaded material is used as the absorbing material 70, $i\mu''$ is very high, and hence the magnetic loss tangent, loss generally, and the attenuation constant specifically, are high as well.

The absorbing material 70 preferably exhibits an attenuation constant of at least approximately −20 dB/cm over frequencies or frequency ranges of interest. Suitable materials for the absorbing material 70 can comprise the 330 Series of rigid and castable absorbers, manufactured by Cuming Microwave Corporation of Avon, Mass. Data sheets for several suitable materials (e.g., the 330-X C-RAM family of materials) are posted at on the internet at the URL address originally cited upon the filing of this application, which data sheets are incorporated herein by reference, and are submitted in the Information Disclosure statement filed with this application.

However, EM attenuation will be improved, and the problem of signal plane switching improved, even at lower levels for the attenuation constant of the absorbing material 70. In a broadest form of the invention, all that is required is that the attenuation constant for the absorbing material 70 for a given frequency be higher (in absolute value) than the attenuation constant for the dielectric which makes up the cavity 67 (e.g., FR4) and or the PCB 50. Or, all that is required is that the loss tangent for the absorbing material 70 for a given frequency be higher than the loss tangent for the dielectric which makes up the cavity 67. In short, the absorbing material 70 need only be more EM absorbent compared to the dielectric inside the cavity.

While it is preferred that the absorbing material 70 have a high magnetic loss tangent, what is ultimately important is that the absorbing material 70 have a higher (e.g., compared to the cavity 67) loss, be it by virtue of the dielectric loss tangent or the magnetic loss tangent. Therefore, the disclosed exemplary absorbing materials, which are primarily magnetically loaded, should be understood as merely exemplary.

The positioning of the absorbing material 70 can occur in several different ways. As shown in FIG. 5, the absorbing material 70 occurs at the edge of the PCB 50. As shown, the absorbing material 70 can have a thickness which supersedes the power and ground planes 62, 64, but can be made thinner, i.e., approximately or equal the thickness of the cavity 67, as shown at 70$x$ ('t'). Moreover, the absorbing material 70 can occur on only one side of the PCB 50, on two opposing sides, or on all four sides, with increasing performance the more sides that are covered. Moreover, the absorbing material 70 need not be continuous on a given side, or at the corners of the PCB 50, although again this would be preferable to maximize absorption of EM disturbances in the cavity 67. In any event, for simplicity, in FIG. 5, the absorbing material 70 is shown only on two opposing sides of the PCB 50.

Figure 2:
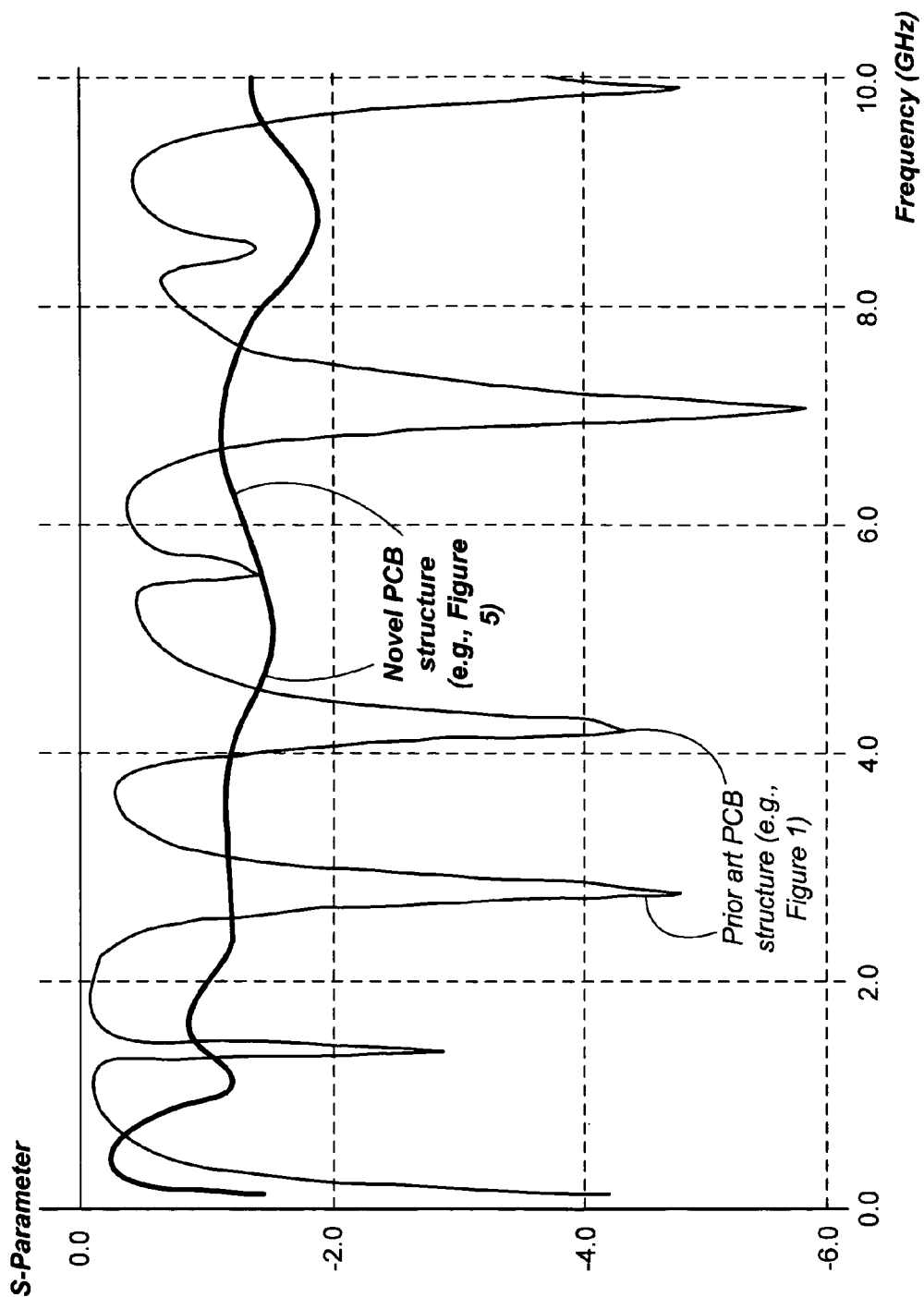
FIGS. 2 and 3 respectively illustrates signal loss and signal reflection (via S-parameters) as a function of frequency for both the prior art via of FIG. 1B and the disclosed via of FIG. 5.
Figure 3:
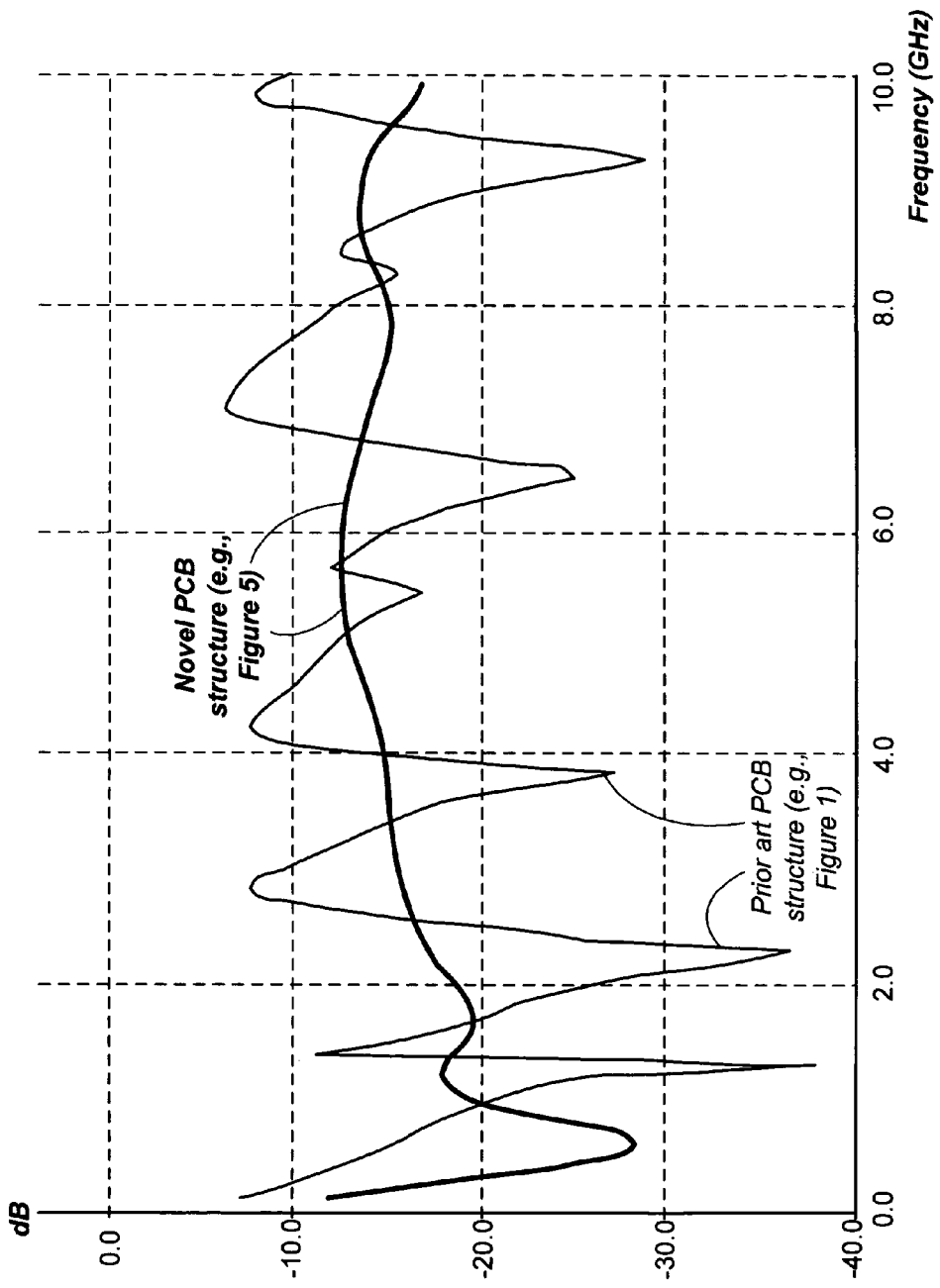
Figure 4:
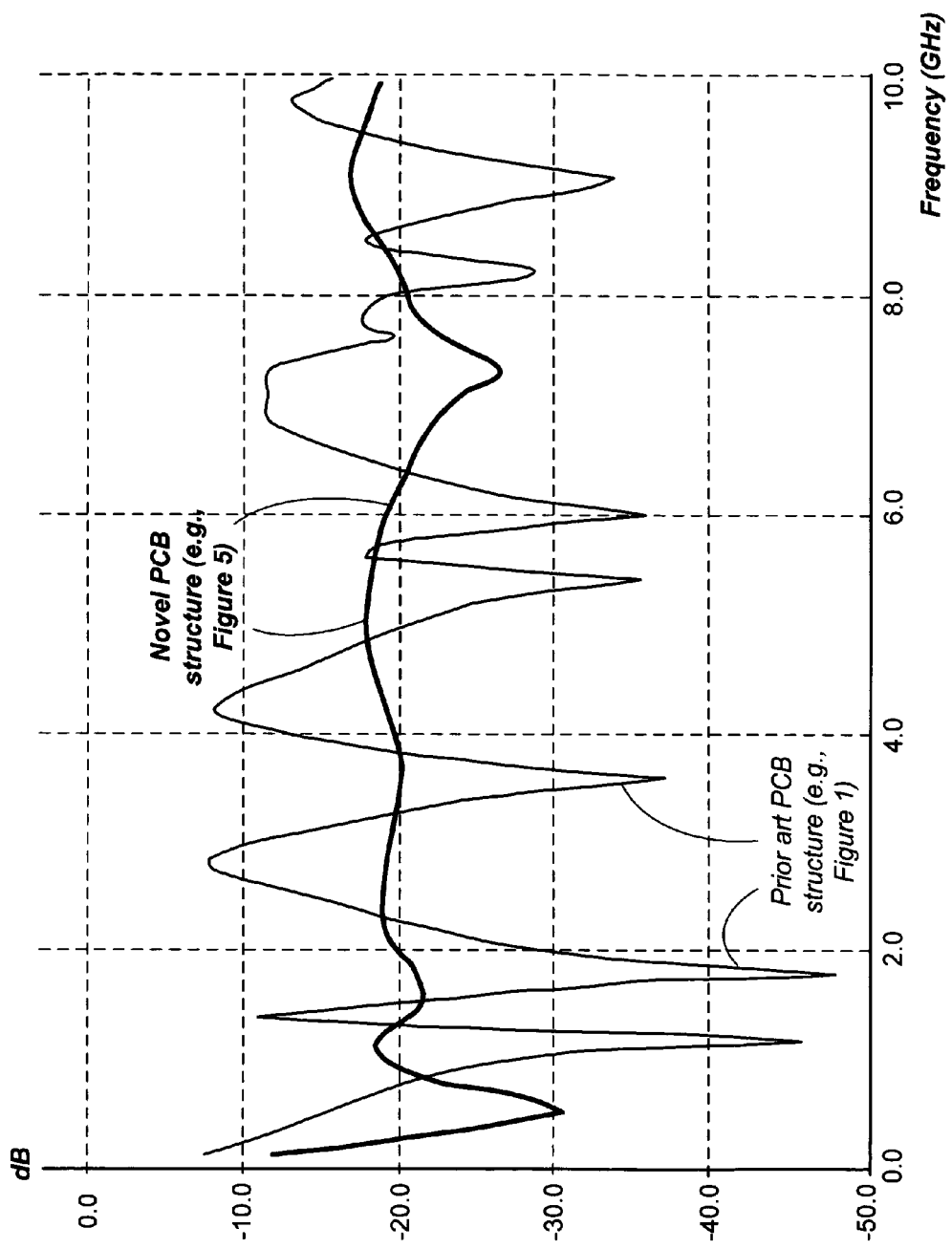
FIG. 4 illustrates via coupling (in dB) as a function of frequency for both the prior art via of FIG. 1B and the disclosed via of FIG. 5.

This PCB design 50 facilitates signal transitioning from one plane to another by reducing the disturbances caused by current return path discontinuities, particularly at high frequencies. Moreover, the PCB design 50 suppresses via-to-via coupling otherwise caused by resonance between the ground and power planes 62, 64 at high frequencies, thereby improving signal integrity and reducing cross-talk from aggressor signals. The improved performance is shown in FIGS. 2-4, which as discussed previously shows computer simulation results indicative of the magnitude of EM disturbances caused by signal plane switching and cross-talk between adjacent vias. Thus, referring again to FIGS. 2 and 3, it is seen that the disclosed PCB structure 50 has an improved transmission and reflection coefficient (i.e., S-parameter), and does not generally suffer large "dips" resulting from unwanted resonance in the cavity between the power planes. Moreover, and referring again to FIG. 4, it can be seen that cross-talk is greatly minimized. As modeled, the PCB 50 of FIG. 5 was similar to that of FIG. 1, but additionally was modeled assuming use of an absorbing material 70 of width (w) 300 mils, with a magnetic loss tangent of approximately 1.0 to 1.5 and an attenuation constant of −20 dB/cm over the broadband of frequencies simulated.

Manufacture of the PCB 50 to add the absorbing material 70 can proceed as shown in FIG. 6 and 7, which respectively illustrate process flows for uses of absorbing materials 70 which are initially in solid (70$a$) or liquid, paste, foam, or epoxy (70$b$) forms. Most of the individual steps in the formation of the PCB involve common techniques well known in the PCB arts, and so are only briefly discussed. Further information on such steps are disclosed in "PCB/Overview" (Apr. 11, 2004), which is published on the internet at the URL address originally cited upon the filing of this application, which is incorporated herein by reference in its entirety, and which is submitted with the Information Disclosure Statement filed with this application.

Figure 6A:
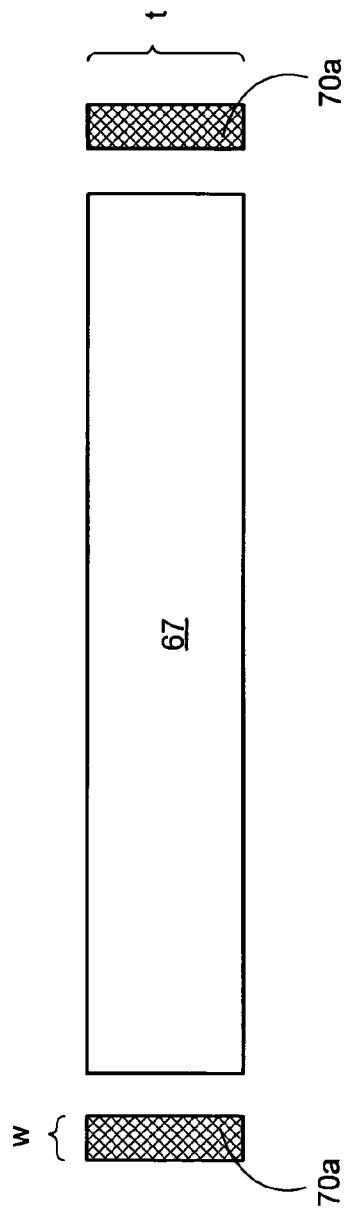

Starting with FIG. 6A, the process of forming a PCB 50 using a rigid absorbing material 70$a$, such as 330-1 C-RAM RGD, is illustrated. As shown, the process begins with the use of a core dielectric cavity material 67, e.g., FR4 having a loss tangent of 0.02. Absorbing material 70$a$, is cut to size, such that its thickness 't' matches that of the cavity material 67. The absorbing material 70$a$ might have a thickness of 54 mils, and a width of 300 mils, and thus is not drawn to scale. Moreover, absorbing material 70$a$ may be formed on all edges of the cavity material 67 (and resulting PCB) although not shown.

Figure 6B:
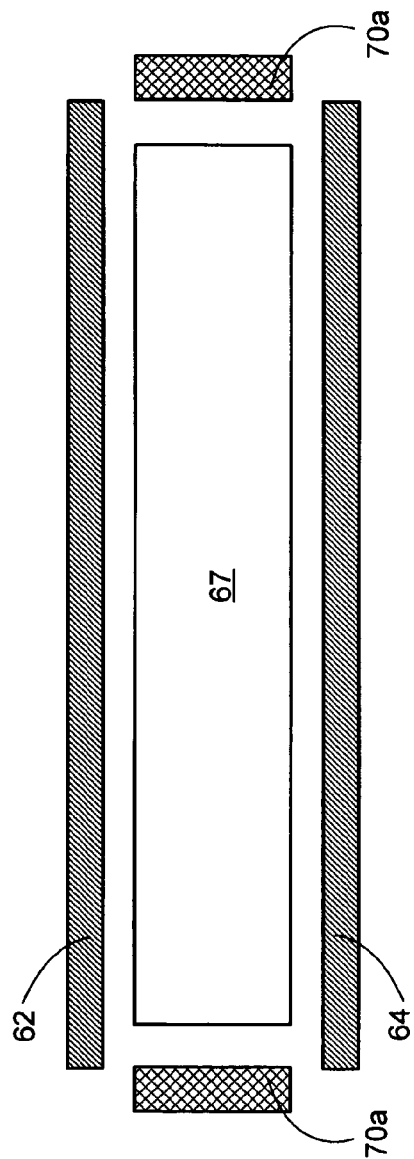
Figure 6C:
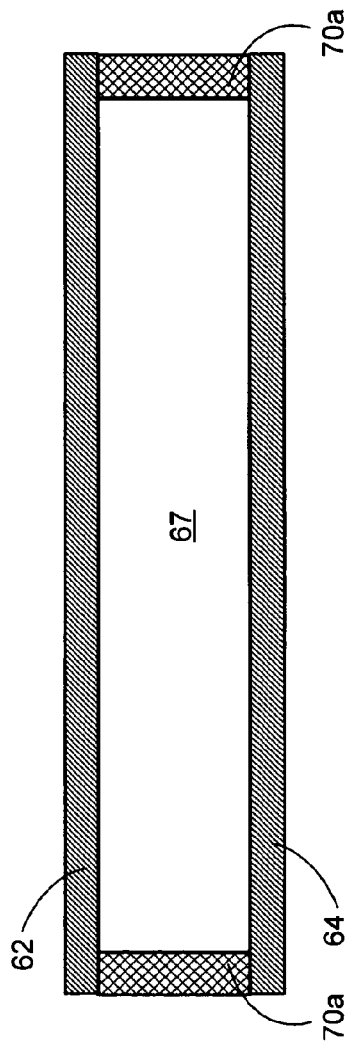

In FIG. 6B, the cladding copper for the power and ground planes 62, 64 is shown. Adhesive is applied to the various internal surfaces and the materials pushed together as shown in FIG. 6C to form an intermediate substrate structure. The thin sheets of absorbing material 70$a$ adhere well to the copper cladding 62, 64, resulting in a stable substrate structure. Thermosetting may also be useful at this stage.

Figure 6D:
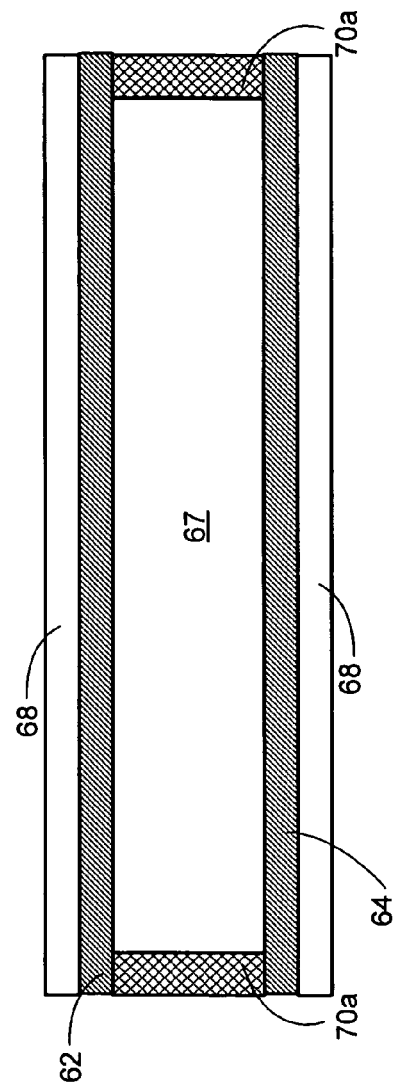

Thereafter, and referring to FIG. 6D, sheets of a dielectric prepreg material 68 are adhered to the top and bottom of the substrate. The prepreg sheets 68 are heated and hardened to adhere them to the remaining substrate, which can occur in a hydraulic press. Once adhered, the prepreg forms the dielectric between the power planes/associated cylinders and the signal traces, as will become evident in the following Figures.

In FIG. 6E, a conductive material 72 for the signal traces is formed on both the top and bottom of the substrate. Plating and/or chemical vapor deposition can be used to form the conductive material 72. Thereafter, and referring to FIG. 6F, a hole for via 60 is formed, e.g., by mechanical or laser drilling. Another conductive material 73 is placed on the sides of the via hole to form via 60, e.g., by plating and/or chemical vapor deposition. In so doing, the conductive material 73 contacts the top and bottom conductive material 72 deposited in FIG. 6E. The conductive material 72 is masked and etched using standard PCB techniques to form the necessary conductors on the top and bottom of the substrate. In particular, and as shown, a signal 72 which switches signal planes through the power planes 62, 64, i.e., the problematic configuration discussed above, although now mitigated by the absorbing material 70$a$ at the edges of the cavity 67.

Figure 7A:
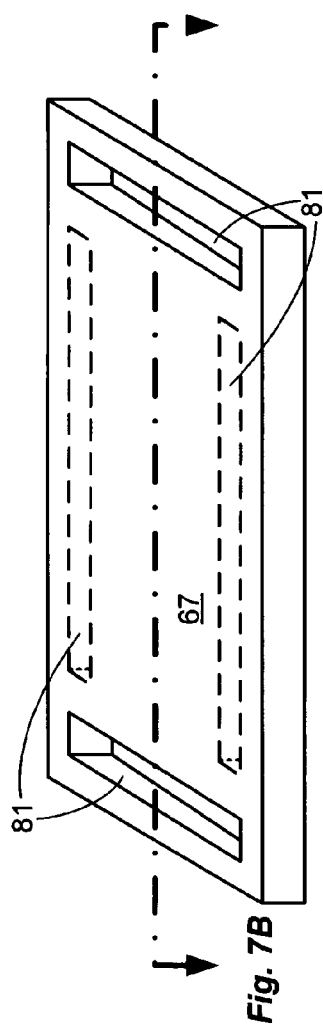
FIGS. 7A-7E illustrate sequential steps for the construction of a PCB having the absorbing material in which the absorbing material is initially non-solid.
Figure 7B:
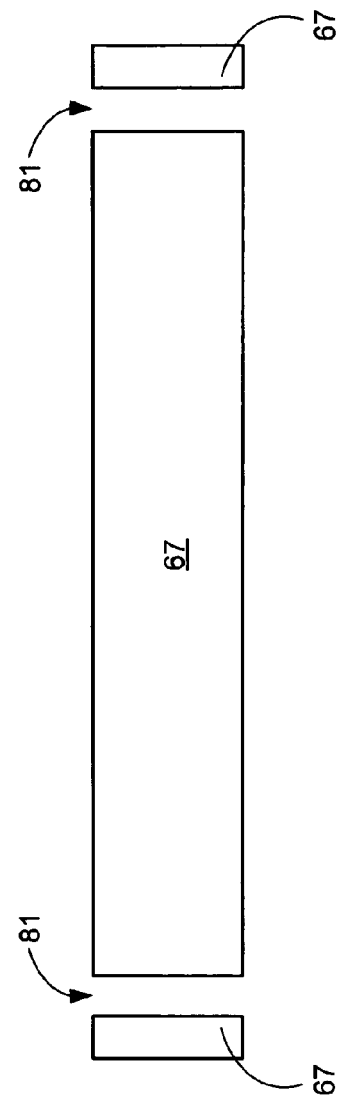
Figure 7C:
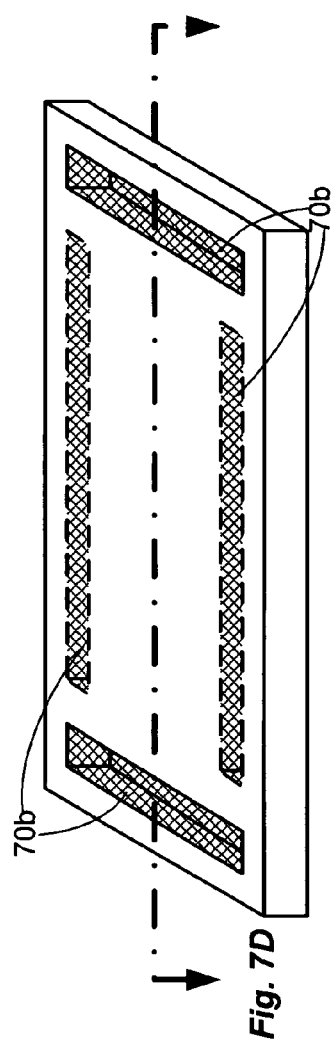
Figure 7D:
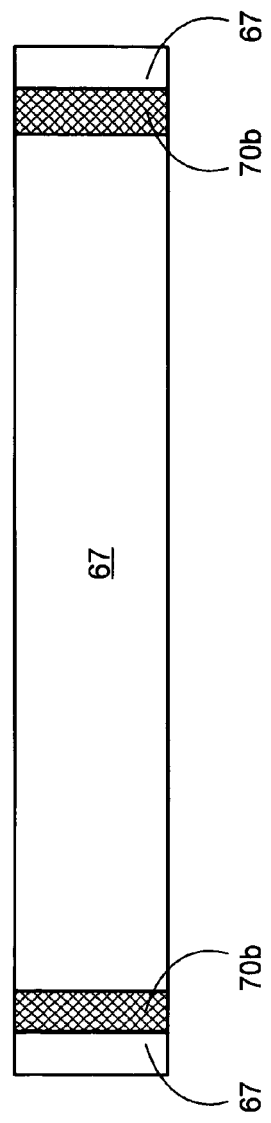
Figure 7E:
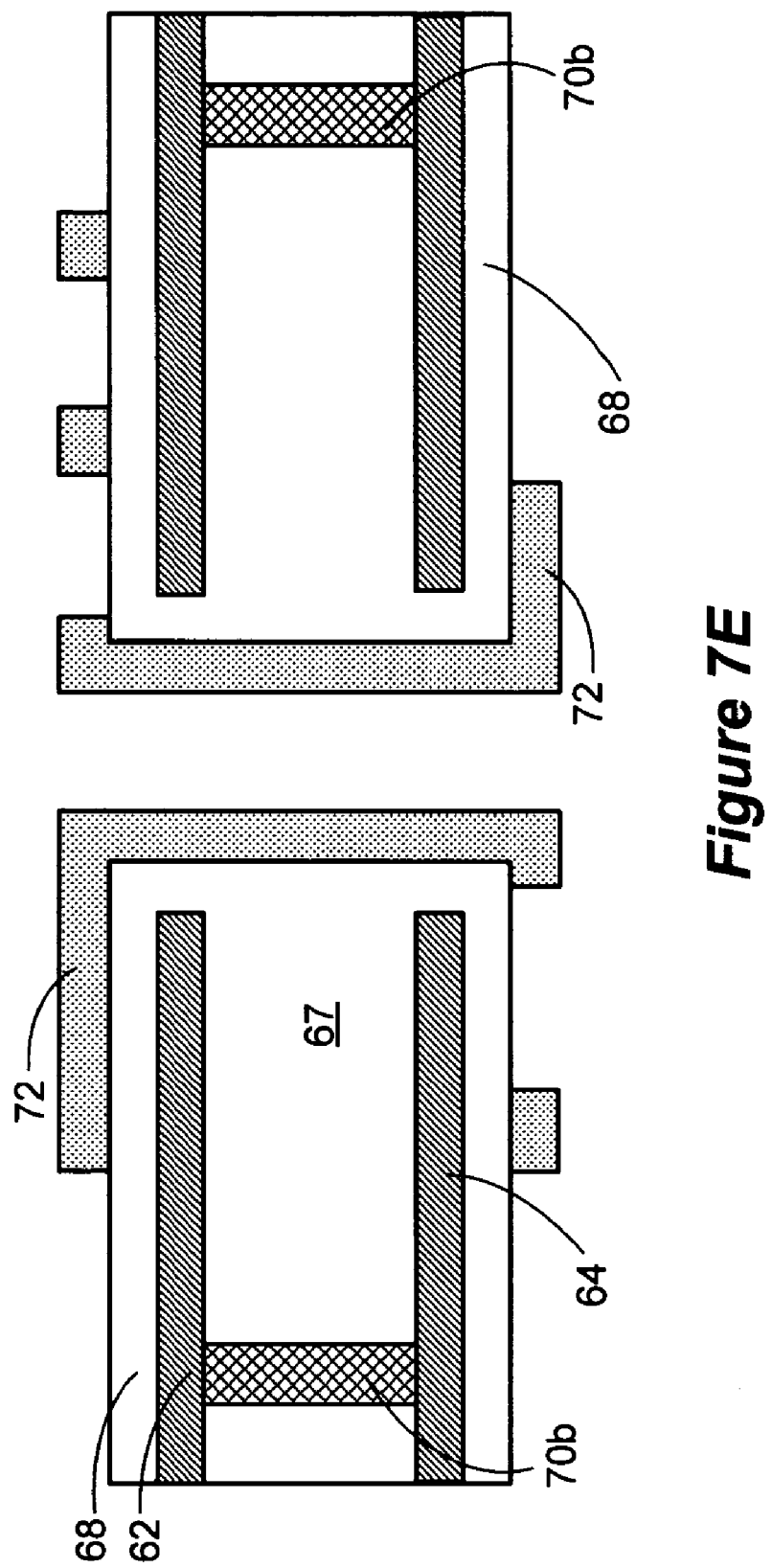

FIGS. 7A-7E illustrate a PCB process flow in which the absorbing materials 70$b$ are initially in liquid, paste, foam, epoxy or other non-solid form, such as 330 Series resin or silicone. Referring first to FIGS. 7A and 7B, notice that the core dielectric cavity material 67, e.g., FR4, has been milled (e.g., mechanically or by laser) to form trenches or holes 81 therein. While the holes 81 are shown completely through the cavity material 67, such holes need not pass completely through. As a first step in the process, shown in FIGS. 7C and 7D, the holes 81 are filled with the absorbing material 70$b$. Depending on the type of material used, it may be necessary to planarize the PCB after application of the absorbing material 70$b$ to remove it from the top and bottom of the PCB. Once in position, the absorbing material 70$b$ is cured and hardened. Thereafter, completion of the PCB can occur using the steps shown in FIG. 6B-6F, arriving at the finished PCB shown in FIG. 7E.

Of course, other modifications to the PCB process to add the absorbing material 70 are possible. For example, the absorbing material 70 can essentially be added to the PCB after it is basically complete. Consider FIG. 5. In this cross section, the absorbing material 70 has basically been added to the edge(s) of an otherwise finished PCB, e.g., by adhesive or melting (if a solid absorbing material 70 is used), or by coating the edges (if a non-solid absorbing material 70 is used). In short, one benefit to the use of the absorbing material only at the edges of the PCB is that the same can easily be applied to an already completed PCB to improve EM performance without the need to redesign and/or re-assemble the PCB. It should be noted with reference to FIGS. 5, 6F, and 7E that the absorbing material 70 can be external or internal to the PCB (compare FIGS. 6F and 7E), can extend along the entirety of the thickness of the edge or can be thinner (see FIG. 5), may or may not come into contact with the power and ground planes (see FIG. 5), and may or may not be laterally spaced from edges of the power and ground planes (as in FIG. 5). All that is required is that the absorbing material 70 be so positioned relative to the power and ground planes to absorb EM radiation resonating in the cavity, and one skilled in the art will recognize that this can occur by placing the absorbing material 70 in several different places at the edge of the PCB, and relative to the power and ground planes.

Although particularly useful in the context of a printed circuit board, the disclosed technique could also be adapted to the reduction of EM disturbances in integrated circuits.

In short, it should be understood that the inventive concepts disclosed herein are capable of many modifications. To the extent such modifications fall within the scope of the appended claims and their equivalents, they are intended to be covered by this patent.

What is claimed is:

1. A circuit structure having different planes, comprising:
   a first signal trace at a first plane;
   a power plane;
   a ground plane;
   a second signal trace at a second plane;
   a via coupling the first signal trace to the second signal trace through the power and ground planes; and
   a magnetically loaded boundary for absorbing electromagnetic radiation at at least one edge of the circuit structure, wherein the boundary is in contact with both the power and ground planes.

2. The circuit structure of claim 1, wherein the boundary occurs at all edges of the circuit structure.

3. The circuit structure of claim 1, wherein the boundary comprises a material having a higher loss tangent than a dielectric on the circuit structure.

4. The circuit structure of claim 1, wherein the boundary comprises a material having a higher attenuation constant than a dielectric on the circuit structure.

5. The circuit structure of claim 1, wherein the circuit structure comprises a printed circuit board.

6. A circuit structure, comprising:
   a signal path transgressing through a via, wherein the via passes through a power plane and a ground plane;
   a cavity between the power and ground planes; and
   a magnetically loaded boundary for absorbing electromagnetic radiation at at least one edge of the cavity, wherein the boundary is in contact with both the power and ground planes.

7. The circuit structure of claim 6, wherein the boundary occurs at all edges of the circuit structure.

8. The circuit structure of claim 6, wherein the cavity comprises a dielectric material having a first loss tangent, and wherein the boundary comprises a material having a second loss tangent higher than the first loss tangent.

9. The circuit structure of claim 6, wherein the cavity comprises a dielectric material having a first attenuation constant, and wherein the boundary comprises a material having a second attenuation constant higher than the first attenuation constant.

10. The circuit structure of claim 6, wherein the boundary is positioned internal to an edge of the circuit structure.

11. The circuit structure of claim 6, wherein the boundary is positioned at an external edge of the circuit structure.

12. The circuit structure of claim 6, wherein the boundary is laterally spaced from edges of the power and ground planes.

13. The circuit structure of claim 6, wherein the circuit structure comprises a printed circuit board.

14. A printed circuit board, comprising:
    a power plane and a ground plane;
    a cavity between the power and ground planes, wherein the cavity comprises a dielectric; and
    a magnetically loaded boundary at at least one edge of the cavity in contact with both the power and ground planes for absorbing electromagnetic radiation, wherein the boundary imparts greater loss to electromagnetic radiation than does the dielectric.

15. The printed circuit board of claim 14, wherein the cavity comprises a dielectric with a first loss tangent and a first attenuation constant, and wherein the material comprises a second loss tangent and a second attenuation constant, and wherein either the second loss tangent or second attenuation constant is higher than the first loss tangent or the first attenuation constant.

16. The printed circuit board of claim 14, wherein the boundary occurs at all edges of the printed circuit board.

17. The printed circuit board of claim 14, wherein the boundary is positioned internal to an edge of the printed circuit board.

18. The printed circuit board of claim 14, wherein the boundary is positioned at an external edge of the printed circuit board.

* * * * *